(12) United States Patent
Lee et al.

(10) Patent No.: US 10,141,286 B2
(45) Date of Patent: Nov. 27, 2018

(54) METHODS OF MANUFACTURING SEMICONDUCTOR PACKAGES

(71) Applicant: Samsung Electronics Co., Ltd., Suwon-si, Gyeonggi-do (KR)

(72) Inventors: Won-Il Lee, Hwaseong-si (KR); Cha-Jea Jo, Yongin-si (KR); Ji-Hwang Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 15/499,229

(22) Filed: Apr. 27, 2017

(65) Prior Publication Data

US 2018/0061812 A1 Mar. 1, 2018

(30) Foreign Application Priority Data

Aug. 24, 2016 (KR) ........................ 10-2016-0107779

(51) Int. Cl.
*H01L 25/065* (2006.01)
*H01L 21/48* (2006.01)
(Continued)

(52) U.S. Cl.
CPC ...... *H01L 25/0657* (2013.01); *H01L 21/4853* (2013.01); *H01L 21/561* (2013.01); *H01L 21/565* (2013.01); *H01L 21/6835* (2013.01); *H01L 23/3114* (2013.01); *H01L 23/3135* (2013.01); *H01L 24/19* (2013.01); *H01L 24/81* (2013.01); *H01L 24/97* (2013.01);
(Continued)

(58) Field of Classification Search
None
See application file for complete search history.

(56) References Cited

U.S. PATENT DOCUMENTS 8,247,898 B2  8/2012 Ono
9,165,986 B2  10/2015 Lin
(Continued)

FOREIGN PATENT DOCUMENTS

KR  10-1030381 B1  4/2011
KR  10-1301838 B1  8/2013

*Primary Examiner* — Eva Yan Montalvo
*Assistant Examiner* — Kevin Quinto
(74) *Attorney, Agent, or Firm* — Myers Bigel, P.A.

(57) ABSTRACT

Methods of manufacturing a semiconductor package are provided. The methods may include manufacturing a semiconductor chip in a first semiconductor manufacturing environment and mounting the semiconductor chip on an upper surface of a printed circuit board. The method may also include forming a molding member in a second semiconductor manufacturing environment that is different from the first semiconductor manufacturing environment, forming a capping member including a material different from the molding member and covering an exposed outer surface of the molding member, and attaching a carrier substrate onto the capping member. The semiconductor chip may be between the printed circuit board and the carrier substrate. The method may further include forming a redistribution line layer on a lower surface of the printed circuit board in a third semiconductor manufacturing environment, forming an external connection member on the redistribution line layer, and removing the carrier substrate.

19 Claims, 18 Drawing Sheets

(51) Int. Cl.
 *H01L 21/56*   (2006.01)
 *H01L 21/683*   (2006.01)
 *H01L 23/31*   (2006.01)
 *H01L 23/00*   (2006.01)
 *H01L 25/18*   (2006.01)
 *H01L 25/00*   (2006.01)
 *H01L 21/02*   (2006.01)

(52) U.S. Cl.
 CPC .............. *H01L 25/18* (2013.01); *H01L 25/50* (2013.01); *H01L 21/0214* (2013.01); *H01L 21/0217* (2013.01); *H01L 21/02164* (2013.01); *H01L 23/3128* (2013.01); *H01L 2221/68359* (2013.01); *H01L 2224/0401* (2013.01); *H01L 2224/04105* (2013.01); *H01L 2224/05025* (2013.01); *H01L 2224/05124* (2013.01); *H01L 2224/05144* (2013.01); *H01L 2224/05147* (2013.01); *H01L 2224/05155* (2013.01); *H01L 2224/05169* (2013.01); *H01L 2224/05184* (2013.01); *H01L 2224/06181* (2013.01); *H01L 2224/11002* (2013.01); *H01L 2224/12105* (2013.01); *H01L 2224/14181* (2013.01); *H01L 2224/16113* (2013.01); *H01L 2224/16146* (2013.01); *H01L 2224/16227* (2013.01); *H01L 2224/17181* (2013.01); *H01L 2224/81005* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06586* (2013.01); *H01L 2924/1431* (2013.01); *H01L 2924/1436* (2013.01); *H01L 2924/1437* (2013.01); *H01L 2924/1443* (2013.01); *H01L 2924/15311* (2013.01); *H01L 2924/18162* (2013.01); *H01L 2924/3511* (2013.01)

(56) References Cited

U.S. PATENT DOCUMENTS

| | | |
|---|---|---|
| 9,287,140 B2 | 3/2016 | Chung et al. |
| 2008/0211078 A1 | 9/2008 | Kwon et al. |
| 2011/0068427 A1* | 3/2011 | Paek ...................... H01L 24/19 |
| | | 257/433 |
| 2016/0052781 A1 | 2/2016 | Jacobsen et al. |
| 2016/0075553 A1 | 3/2016 | Bilic et al. |
| 2016/0119722 A1 | 4/2016 | Chu et al. |

* cited by examiner

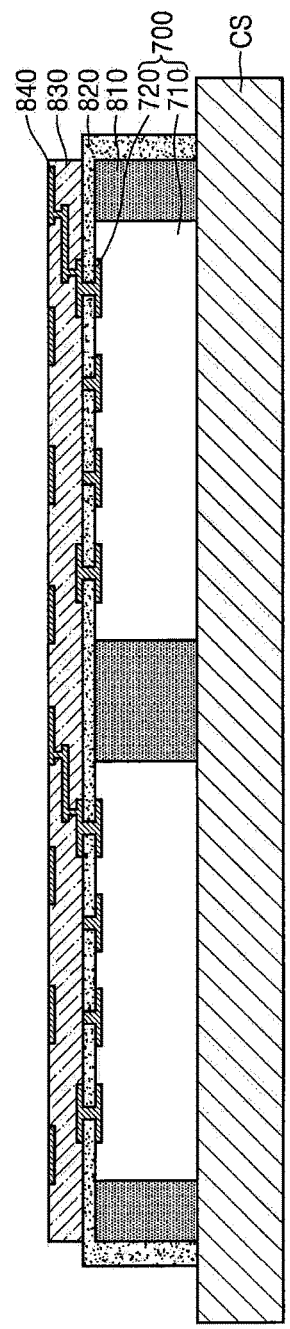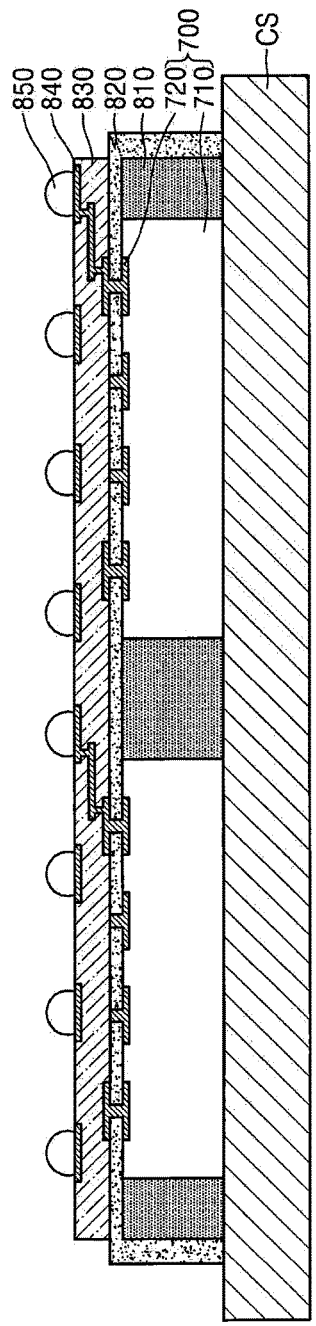

METHODS OF MANUFACTURING SEMICONDUCTOR PACKAGES

CROSS-REFERENCE TO RELATED APPLICATION

This application claims priority under 35 U.S.C. § 119 to Korean Patent Application No. 10-2016-0107779, filed on Aug. 24, 2016, in the Korean Intellectual Property Office, the disclosure of which is incorporated by reference herein in its entirety.

BACKGROUND

The present disclosure generally relates to a method of manufacturing a semiconductor package, and more particularly, to a method of manufacturing a semiconductor package including redistribution lines.

According to the tremendous development of electronics and users' demand, electronic devices are getting smaller and lighter, and semiconductor packages used in the electronic devices have become high performance and high capacity as well as smaller and lighter. In order to realize high performance and high capacity along with miniaturization and light weight, research and development into semiconductor packages including stacked semiconductor chips and wafer level packages have been continuously conducted.

SUMMARY

The present inventive concepts provide methods of manufacturing a semiconductor package, whereby high performance and high capacity may be realized along with miniaturization and light weight.

According to some embodiments of the present inventive concepts, there is provided a method of manufacturing a semiconductor package. The method may include manufacturing a semiconductor chip in a first semiconductor manufacturing environment and mounting the semiconductor chip on an upper surface of a printed circuit board. The printed circuit board includes a lower surface opposite the upper surface. The method may also include forming a molding member in a second semiconductor manufacturing environment that is different from the first semiconductor manufacturing environment, forming a capping member including a material different from the molding member and covering an exposed outer surface of the molding member, and attaching a carrier substrate onto the capping member. The semiconductor chip may be between the printed circuit board and the carrier substrate. The method may further include forming a redistribution line layer on the lower surface of the printed circuit board in a third semiconductor manufacturing environment, forming an external connection member on the redistribution line layer, and removing the carrier substrate. The redistribution line layer may be electrically connected to the semiconductor chip.

According to some embodiments of the present inventive concepts, there is provided a method of manufacturing a semiconductor package. The method may include manufacturing a first semiconductor chip, mounting the first semiconductor chip on a substrate, forming a first molding member covering side surfaces of the first semiconductor chip, forming a capping member including a material different from the first molding member and covering the first molding member and an upper surface of the first semiconductor chip, and forming a redistribution line layer on the capping member. The redistribution line layer may be electrically connected to the first semiconductor chip.

According to some embodiments of the present inventive concepts, there is provided a method of manufacturing a semiconductor package. The method may include mounting a semiconductor chip on a first surface of a substrate. The substrate includes a second surface opposite the first surface. The method may also include forming a molding layer on the semiconductor chip and forming a capping layer entirely covering an exposed outer surface of the molding layer. The capping layer may include a material different from the molding layer. The method may further include attaching a carrier substrate to the capping layer and forming a redistribution line layer on the second surface of the substrate after forming the capping layer. The semiconductor chip may be between the substrate and the carrier substrate.

BRIEF DESCRIPTION OF THE DRAWINGS

Embodiments of the present inventive concepts will be more clearly understood from the following detailed description taken in conjunction with the accompanying drawings in which:

FIGS. 12 to 18 are cross-sectional views illustrating a method of manufacturing a semiconductor package according to some embodiments of the present inventive concepts;

DETAILED DESCRIPTION

Hereinafter, some embodiments of the present inventive concepts will be described in detail with reference to the accompanying drawings. As used herein the term "and/or" includes any and all combinations of one or more of the associated listed items.

FIGS. 1 to 11 are cross-sectional views illustrating a method of manufacturing a semiconductor package according to some embodiments of the present inventive concepts. In some embodiments, process steps illustrated in FIGS. 1 to 11 may be performed sequentially in order.

Figure 1:
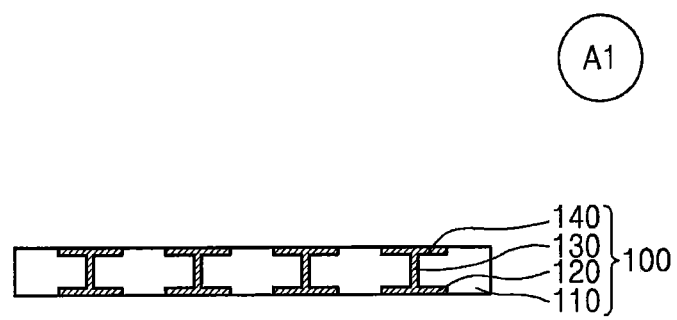
FIGS. 1 to 11 are cross-sectional views illustrating a method of manufacturing a semiconductor package according to some embodiments of the present inventive concepts.

Referring to FIG. 1, a first semiconductor chip 100 may be manufactured in a first semiconductor manufacturing environment A1.

The first semiconductor chip 100 may include a first semiconductor substrate 110, a first lower connection pad 120, a first through silicon via 130, and a first upper connection pad 140.

The first semiconductor substrate 110 may include an upper surface and a lower surface opposite the upper surface. The first through silicon via 130 may penetrate (i.e., may extend all the way through) the first semiconductor substrate 110 and extend from the upper surface of the first semiconductor substrate 110 toward the lower surface thereof, and may electrically connect the first lower connection pad 120 and the first upper connection pad 140 to each other.

The first semiconductor substrate 110 may include, for example, silicon. In some embodiments, the first semiconductor substrate 110 may include a semiconductor element such as germanium, or a compound semiconductor such as silicon carbide (SiC), gallium arsenide (GaAs), indium arsenide (InAs), and indium phosphide (InP). In some embodiments, the first semiconductor substrate 110 may have a silicon-on-insulator (SOI) structure. For example, the first semiconductor substrate 110 may include a buried oxide (BOX) layer. The first semiconductor substrate 110 may include a conductive region, for example, a well doped with impurities or a structure doped with impurities. Also, the first semiconductor substrate 110 may have various device isolation structures such as a shallow trench isolation (STI) structure.

The first through silicon via 130 may extend from the upper surface of the first semiconductor substrate 110 toward the lower surface of the first semiconductor substrate 110, and may extend all the way through the first semiconductor substrate 110. At least a portion of the first through silicon via 130 may have a pillar shape.

Through silicon vias may be classified into via-first, via-middle, and via-last according to manufacturing processes. The via-first refers to a structure in which a through silicon via is formed before an integrated circuit layer of a semiconductor device is formed, the via-middle refers to a structure in which, after an integrated circuit layer of a semiconductor device is formed, the through silicon via is formed before an interconnection portion is formed, and the via-last refers to a structure in which a through silicon via is formed after an interconnection portion is formed.

The first lower connection pad 120 may be disposed on the lower surface of the first semiconductor substrate 110 and may be electrically connected to the first through silicon via 130. The first lower connection pad 120 may include, for example, at least one of aluminum (Al), copper (Cu), nickel (Ni), tungsten (W), platinum (Pt), and gold (Au). Also, although not illustrated, a lower passivation layer may partially surround a side surface of the first lower connection pad 120 at the lower surface of the first semiconductor substrate 110.

The first upper connection pad 140 may be disposed on the upper surface of the first semiconductor substrate 110 and may be electrically connected to the first through silicon via 130. For example, the first upper connection pad 140 may include the same material as that of the first lower connection pad 120. Also, although not illustrated, an upper passivation layer may partially surround a side surface of the first upper connection pad 140 at the upper surface of the first semiconductor substrate 110.

The first semiconductor chip 100 may be manufactured in the first semiconductor manufacturing environment A1. The first semiconductor manufacturing environment A1, which is an manufacturing environment for a semiconductor device and/or a semiconductor package where ultra-fine processes are performed, may include a contamination source (e.g., fine dust, a metallic contamination source, an organic material, gas, or germs) that may need to be removed and may need to maintain a certain level of cleanliness all the time because contamination sources may influence quality or yield of the semiconductor device and the semiconductor package.

Space which may maintain such cleanliness is called a clean room. Controlling a contamination source of the clean room is important for a semiconductor package manufacturing process whereby high performance and high capacity may be realized along with miniaturization and light weight of the semiconductor package. Accordingly, only the materials proved not to generate a contamination source such as fine dust may be used in the first semiconductor manufacturing environment A1.

Figure 2:
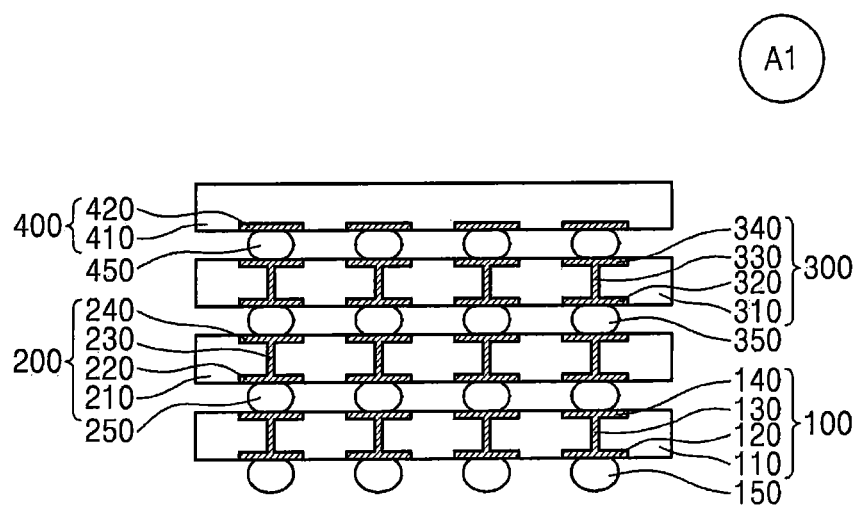

Referring to FIG. 2, the first semiconductor chip 100, a second semiconductor chip 200, a third semiconductor chip 300, and a fourth semiconductor chip 400 may be stacked on one another in the first semiconductor manufacturing environment A1.

The second to fourth semiconductor chips 200 to 400 may be manufactured in the same first semiconductor manufacturing environment A1 as the first semiconductor chip 100 and may have substantially the same uses, structures, forms, and technical features as the first semiconductor chip 100.

The first to fourth semiconductor chips 100 to 400 may be electrically connected to one another or electrically connected to a substrate 500 (refer to FIG. 3) through first to fourth connection members 150, 250, 350, and 450. Also, the first to fourth semiconductor chips 100 to 400 may be attached to one another by a non-conductive film (NCF) (not shown).

The first to fourth semiconductor chips 100 to 400 may be logic chips or memory chips. For example, all of the first to fourth semiconductor chips 100 to 400 may be memory chips of the same type. In some embodiments, some of the first to fourth semiconductor chips 100 to 400 may be memory chips, and some others may be logic chips.

The memory chips may be, for example, volatile memory chips such as dynamic random access memory (DRAM) or static RAM (SRAM), or non-volatile memory chips such as phase-change RAM (PRAM), magnetoresistive RAM (MRAM), ferroelectric RAM (FRAM), or resistive RAM (RRAM). In some embodiments, the first to fourth semiconductor chips 100 to 400 may be high bandwidth memory (HBM) DRAM. Also, the logic chips may be, for example, microprocessors, analog devices, or digital signal processors.

Although the first to fourth semiconductor chips 100 to 400 are illustrated stacked vertically as an example, the number of semiconductor chips stacked in a semiconductor package 10 (refer to FIG. 11) is not limited thereto. For example, two, three, or five or more semiconductor chips may be stacked in the semiconductor package 10.

The first connection member 150 may be disposed on the first lower connection pad 120. The first connection member 150 may be used to electrically connect the first semiconductor chip 100 to the substrate 500. Through the first connection member 150, at least one of a control signal, a power signal, and a ground signal for operations of the first to fourth semiconductor chips 100 to 400 may be externally received, a data signal to be stored in the first to fourth semiconductor chips 100 to 400 may be externally received, or data stored in the first to fourth semiconductor chips 100 to 400 may be externally provided. For example, the first connection member 150 may include a pillar structure, a ball structure, or a solder layer.

The second semiconductor chip 200 may be mounted on the upper surface of the first semiconductor chip 100. The second semiconductor chip 200 may be electrically connected to the first semiconductor chip 100 through the second connection member 250 disposed between the first semiconductor chip 100 and the second semiconductor chip 200.

Also, an NCF (not shown) may be disposed between the upper surface of the first semiconductor chip 100 and a lower surface of the second semiconductor chip 200 to attach the second semiconductor chip 200 onto the first semiconductor chip 100.

The third semiconductor chip 300 may be mounted on an upper surface of the second semiconductor chip 200, and the fourth semiconductor chip 400 may be mounted on an upper surface of the third semiconductor chip 300. An NCF (not shown) surrounding the third connection member 350 and a side surface of the third connection member 350 may be disposed between the second semiconductor chip 200 and the third semiconductor chip 300. An NCF (not shown) surrounding the fourth connection member 450 and a side surface of the fourth connection member 450 may be disposed between the third semiconductor chip 300 and the fourth semiconductor chip 400.

The second semiconductor chip 200 may include a second semiconductor substrate 210, a second lower connection pad 220, a second through silicon via 230, and a second upper connection pad 240.

The third semiconductor chip 300 may include a third semiconductor substrate 310, a third lower connection pad 320, a third through silicon via 330, and a third upper connection pad 340.

The fourth semiconductor chip 400 may include a fourth semiconductor substrate 410 and a fourth lower connection pad 420. Unlike the first to third semiconductor chips 100 to 300, the fourth semiconductor chip 400 may not have a through silicon via.

Figure 3:
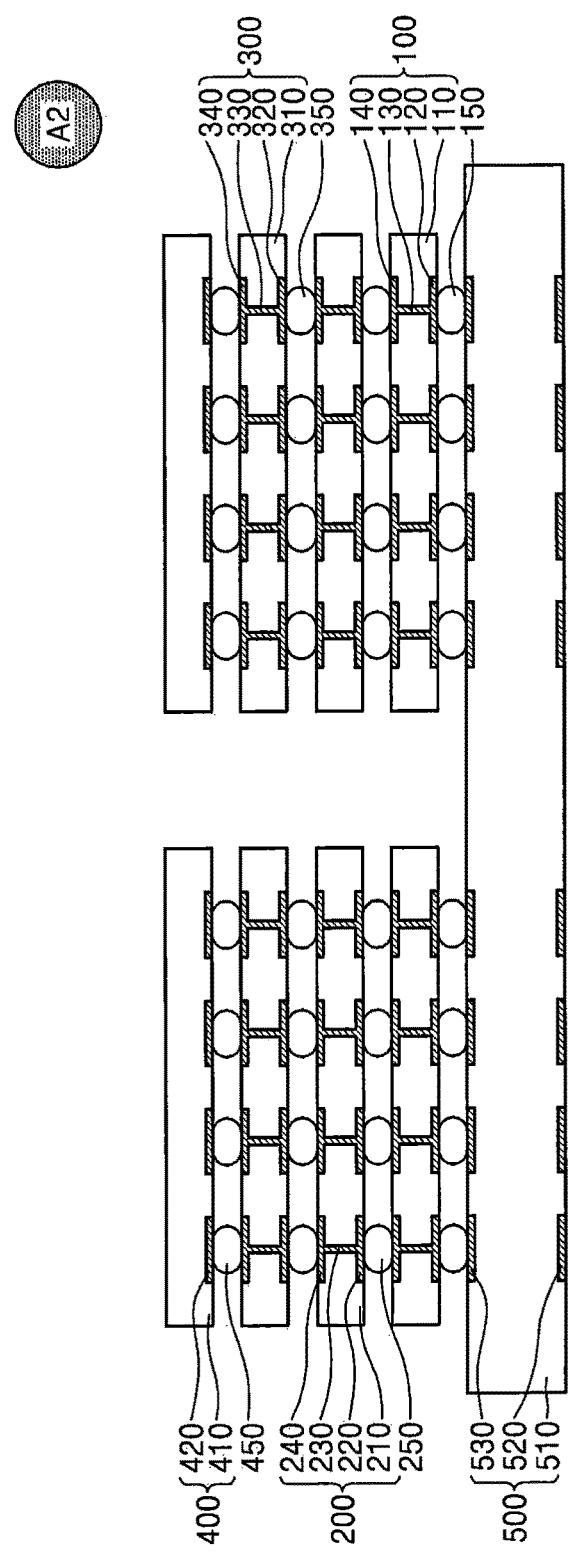

Referring to FIG. 3, the first semiconductor chip 100, the second semiconductor chip 200, the third semiconductor chip 300, and the fourth semiconductor chip 400 stacked vertically may be mounted on the substrate 500 in a second semiconductor manufacturing environment A2.

Although the first to fourth semiconductor chips 100 to 400 configuring two sets and vertically stacked on the substrate 500 are illustrated in FIG. 3 for convenience of description, they are not limited thereto.

In some embodiments, the first to fourth semiconductor chips 100 to 400 may be mounted on the substrate 500 while having already been stacked on one another to configure a set as described above with reference to FIG. 2.

In some embodiments, the first to fourth semiconductor chips 100 to 400 may be sequentially stacked and mounted on the substrate 500. That is, the first semiconductor chip 100 may be mounted on the substrate 500, the second semiconductor chip 200 may be stacked on the mounted first semiconductor chip 100, the third semiconductor chip 300 may be stacked on the stacked second semiconductor chip 200, and the fourth semiconductor chip 400 may be stacked on the stacked third semiconductor chip 300 to configure a set.

Although the first to fourth semiconductor chips 100 to 400 vertically stacked on the substrate 500 are illustrated as an example, the number of semiconductor chips stacked in the semiconductor package 10 (refer to FIG. 11) is not limited thereto. For example, two, three, or five or more semiconductor chips may be stacked in the semiconductor package 10.

The substrate 500 may be, for example, a printed circuit board, a ceramic substrate, or an interposer.

When the substrate 500 is a printed circuit board, the substrate 500 may include a body portion 510, a lower surface pad 520, an upper surface pad 530, and solder resist layers (not shown) on a lower surface and an upper surface of the body portion 510. Internal interconnection (not shown) electrically connecting the lower surface pad 520 and the upper surface pad 530 to each other may be formed in the body portion 510. The lower surface pad 520 and the upper surface pad 530 may be portions of circuit interconnection patterned after coating the lower surface and the upper surface of the body portion 510 with Cu foil, the portions being exposed by the solder resist layers respectively formed on the lower surface and the upper surface of the body portion 510.

When the substrate 500 is an interposer, the substrate 500 may include the body portion 510 including a semiconductor material, and the lower surface pad 520 and the upper surface pad 530 respectively on a lower surface and an upper surface of the body portion 510. The body portion 510 may be, for example, formed from a silicon wafer. Also, internal interconnection (not shown) may be formed on the lower surface or the upper surface of the body portion 510, or in the body portion 510. Also, a through silicon via (not shown) electrically connecting the lower surface pad 520 and the upper surface pad 530 to each other may be formed in the body portion 510.

As described above, the first semiconductor manufacturing environment A1 may include a contamination source that may need to be removed and need to maintain a certain level of cleanliness all the time in order to manufacture a semiconductor device. However, a process of mounting semiconductor chips on the substrate 500 may be performed in the second semiconductor manufacturing environment A2 having cleanliness that is less than that of the first semiconductor manufacturing environment A1.

It may cost much more to manage a clean room maintaining high cleanliness than to manage a clean room maintaining relatively low cleanliness. Accordingly, a semiconductor package manufacturing process that may be performed in the clean room maintaining relatively low cleanliness, in other words, the second semiconductor manufacturing environment A2, as well may be performed in the second semiconductor manufacturing environment A2 by taking economic aspects into account.

Figure 4:
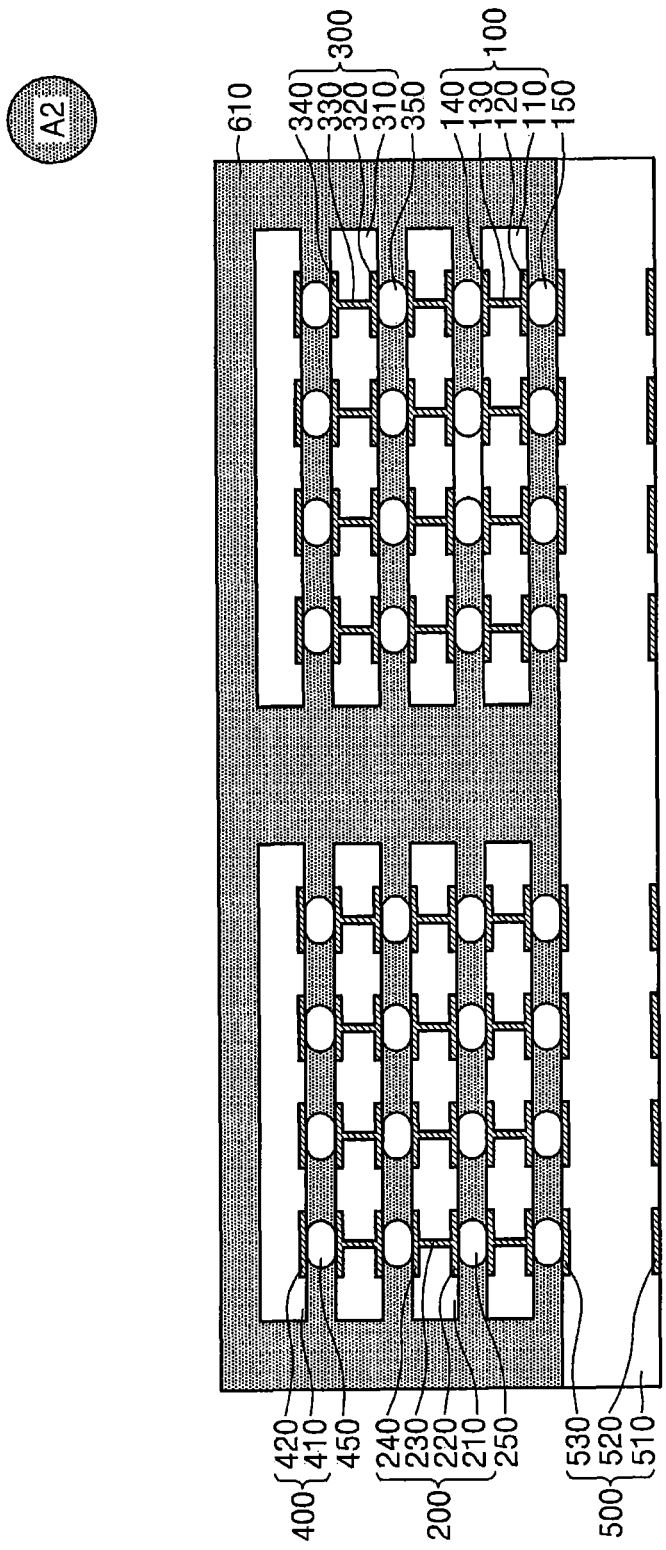

Referring to FIG. 4, a molding member 610 covering the first to fourth semiconductor chips 100 to 400 may be formed in the second semiconductor manufacturing environment A2 that is different from the first semiconductor manufacturing environment A1 (refer to FIG. 1).

The molding member 610 may protect the first to fourth semiconductor chips 100 to 400 from external influence such as shock. In order to play such a role, the molding member 610 may include, for example, an epoxy mold compound (EMC), resin, or the like. Also, the molding member 610 may be formed by, for example, a process such as compression molding, lamination, or screen printing. In some embodiments, the molding member 610 may expose an upper surface of the fourth semiconductor chip 400 to the outside.

The EMC and resin, which are materials used to form the molding member 610, may generally cause a contamination source such as fine dust. The contamination source may degrade cleanliness of a clean room, and thus, a process of forming the molding member 610 may be performed in an environment different from that for a process of manufacturing a semiconductor device. That is, the process of forming the molding member 610 may be performed in the second semiconductor manufacturing environment A2 having cleanliness that is less than that of the first semiconductor manufacturing environment A1.

Figure 5:
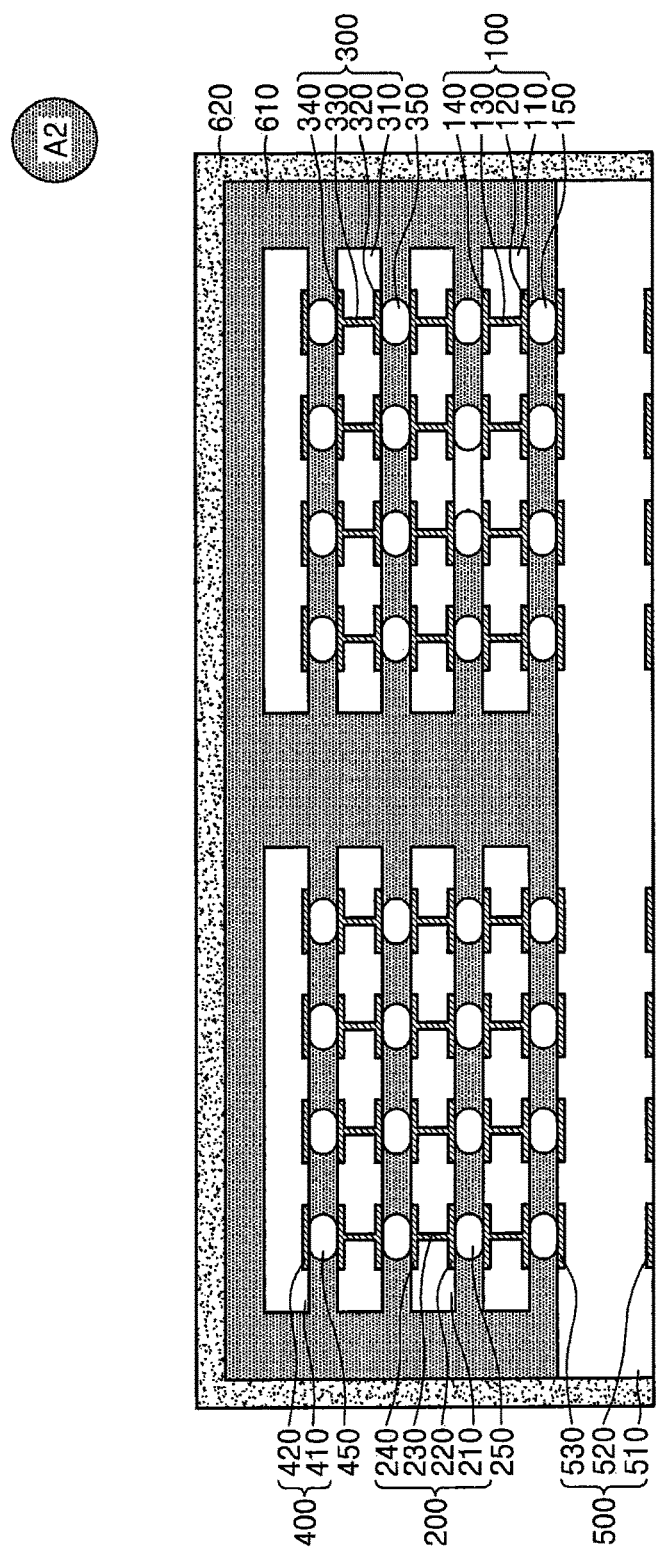

Referring to FIG. 5, a capping member 620 including a material different from that of the molding member 610 and covering an outer surface of the molding member 610 not to expose the molding member 610 may be formed. In some embodiments, the capping member 620 may cover an entirety of an exposed outer surface of the molding member 610 that is exposed by the substrate 500 as illustrated in FIG. 5. Accordingly, the molding member 610 may be surrounded by the substrate 500 and the capping member 620 when viewed in cross section.

The capping member 620 may entirely cover side surfaces and an upper surface of the molding member 610 not to expose any portion of the molding member 610 to the outside. In some embodiments, the capping member 620 may also cover side surfaces of the substrate 500. That is, the capping member 620 may totally encapsulate the molding member 610.

The process of forming the capping member 620 may be performed in the second semiconductor manufacturing environment A2.

As described above, in order to remove a contamination source in a manufacturing environment and maintain a certain level of cleanliness all the time, only the materials proved not to generate a contamination source such as fine dust may be used in the first semiconductor manufacturing environment A1 (refer to FIG. 1) because when a material causing a by-product such as a contamination source is used, the by-product may contaminate semiconductor device manufacturing equipment and/or may degrade cleanliness of a clean room.

In some embodiments of the present inventive concepts, a material proved not to cause a contamination source may be used to cap the molding member 610 including a material that may cause a contamination source, and thus, a succeeding semiconductor package manufacturing process such as a process of forming a redistribution line layer may be performed in the first semiconductor manufacturing environment A1.

The capping member 620 covering the molding member 610 may reduce or possibly prevent a contamination source that may be generated from the molding member 610 from being discharged to an external environment such as a clean room, thereby lessening a problem of investing in equipment only for a semiconductor package manufacturing process, such as a process of forming a redistribution line layer, after forming the molding member 610 or having to change process design into a complex and difficult one.

The capping member 620 may include, for example, an insulating material such as a silicon oxide film, a silicon nitride film, or a silicon oxynitride film, which is a material proved to be usable in the first semiconductor manufacturing environment A1. Also, the capping member 620 may be previously manufactured for use in the form of tape, and a material and a form of the capping member 620 may be modified according to a process, a structure, and an environment in which capping is required.

Figure 6:
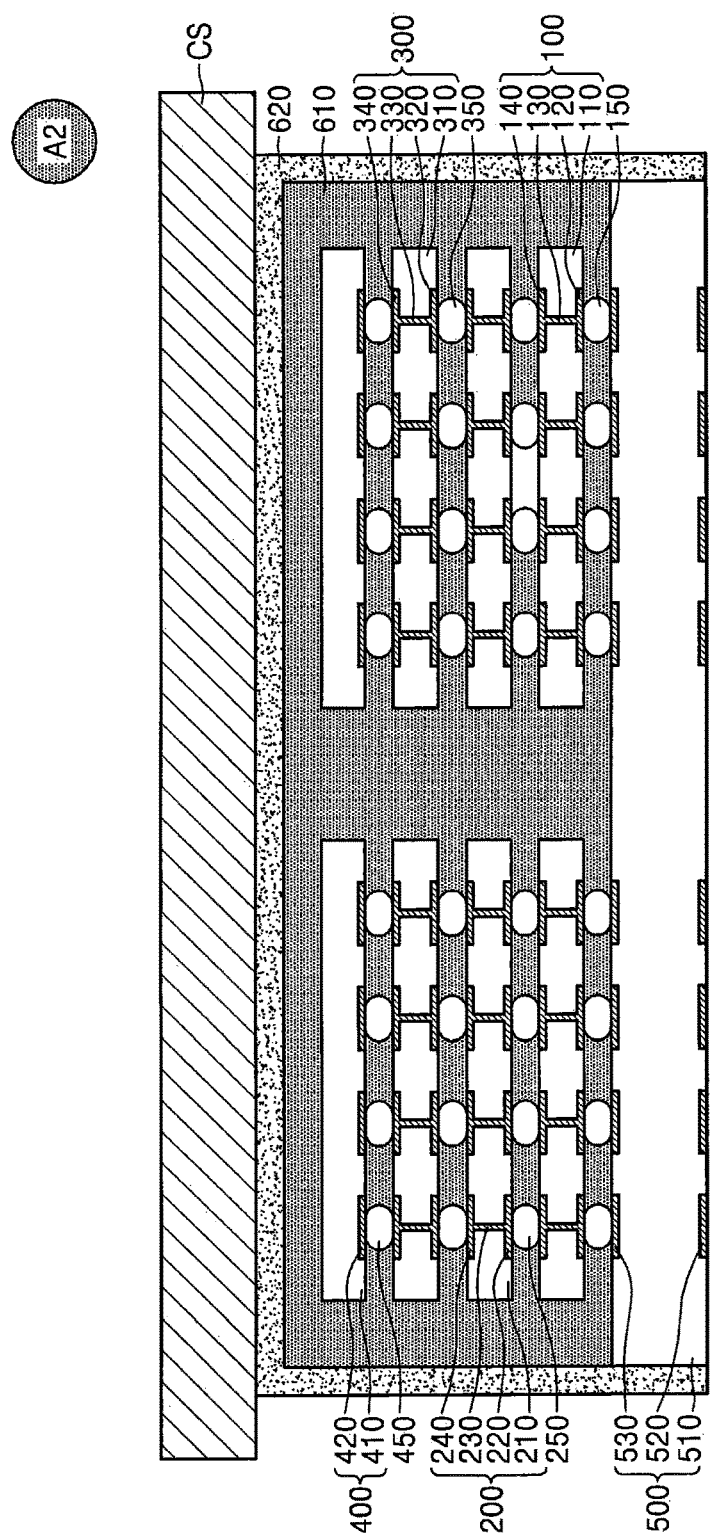

Referring to FIG. 6, a carrier substrate CS may be attached onto the capping member 620 to face the substrate 500.

In order to perform a succeeding semiconductor package manufacturing process, such as a process of forming a redistribution line layer, on a lower surface of the substrate 500, the carrier substrate CS may be attached. The carrier substrate CS may include, for example, glass, silicon, or aluminum oxide. In order to facilitate attachment of the carrier substrate CS, an adhesive layer (not shown) may be formed between the carrier substrate CS and the capping member 620. The adhesive layer may be a liquid type or a gel type that may be easily transformed at predetermined pressure.

The process of attaching the carrier substrate CS onto the capping member 620 may be performed in the second semiconductor manufacturing environment A2.

Figure 7:
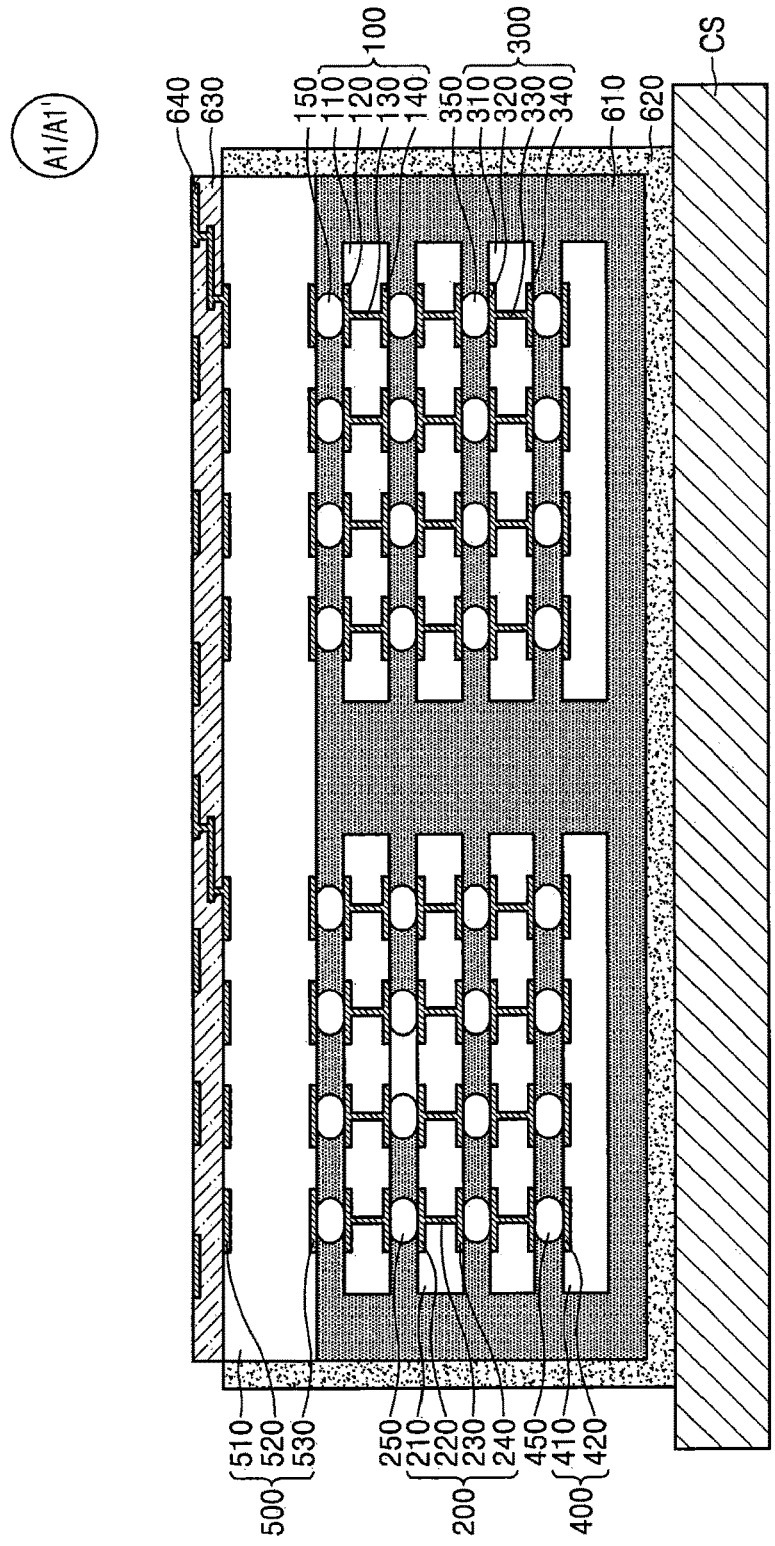

Referring to FIG. 7, a redistribution line layer 640 may be formed on the lower surface of the substrate 500 in the first semiconductor manufacturing environment A1 or a semiconductor manufacturing environment A1' that is similar to the first semiconductor manufacturing environment A1.

The redistribution line layer 640 may electrically connect the first to fourth semiconductor chips 100 to 400 mounted on the substrate 500 to the outside. Also, an insulation layer 630 surrounding the redistribution line layer 640 may be formed. The redistribution line layer 640 may be directly formed on the substrate 500.

The redistribution line layer 640 may include, for example, a conductive material, such as metal or an alloy, for example, copper (Cu), aluminum (Al), nickel (Ni), platinum (Pt), silver (Ag), gold (Au), or a combination thereof. The insulation layer 630 may include, for example, an inorganic insulating material such as a silicon oxide film, a silicon nitride film, or a silicon oxynitride film, or an organic polymer insulating material such as polyimide.

The contamination source may not be discharged from the molding member 610 because the capping member 620 covers the molding member 610, and thus, the redistribution line layer 640 and the insulation layer 630 may be formed on the lower surface of the substrate 500 in the first semiconductor manufacturing environment A1 or the semiconductor manufacturing environment A1' that is similar to the first semiconductor manufacturing environment A1.

In this respect, the semiconductor manufacturing environment A1' that is similar to the first semiconductor manufacturing environment A1 refers to an environment for a different product line having the same cleanliness as that of the first semiconductor manufacturing environment A1, or an environment for a product line having cleanliness similar to that of the first semiconductor manufacturing environment A1 and higher than that of the second semiconductor manufacturing environment A2.

Thus, the semiconductor package manufacturing process may be performed by using existing pieces of semiconductor device manufacturing equipment, and accordingly, manufacturing efficiency and manufacturing yield may increase, and manufacturing cost may decrease. For example, the redistribution line layer 640 and the insulation layer 630 may be formed by a general photo-process and etching process.

Figure 8:
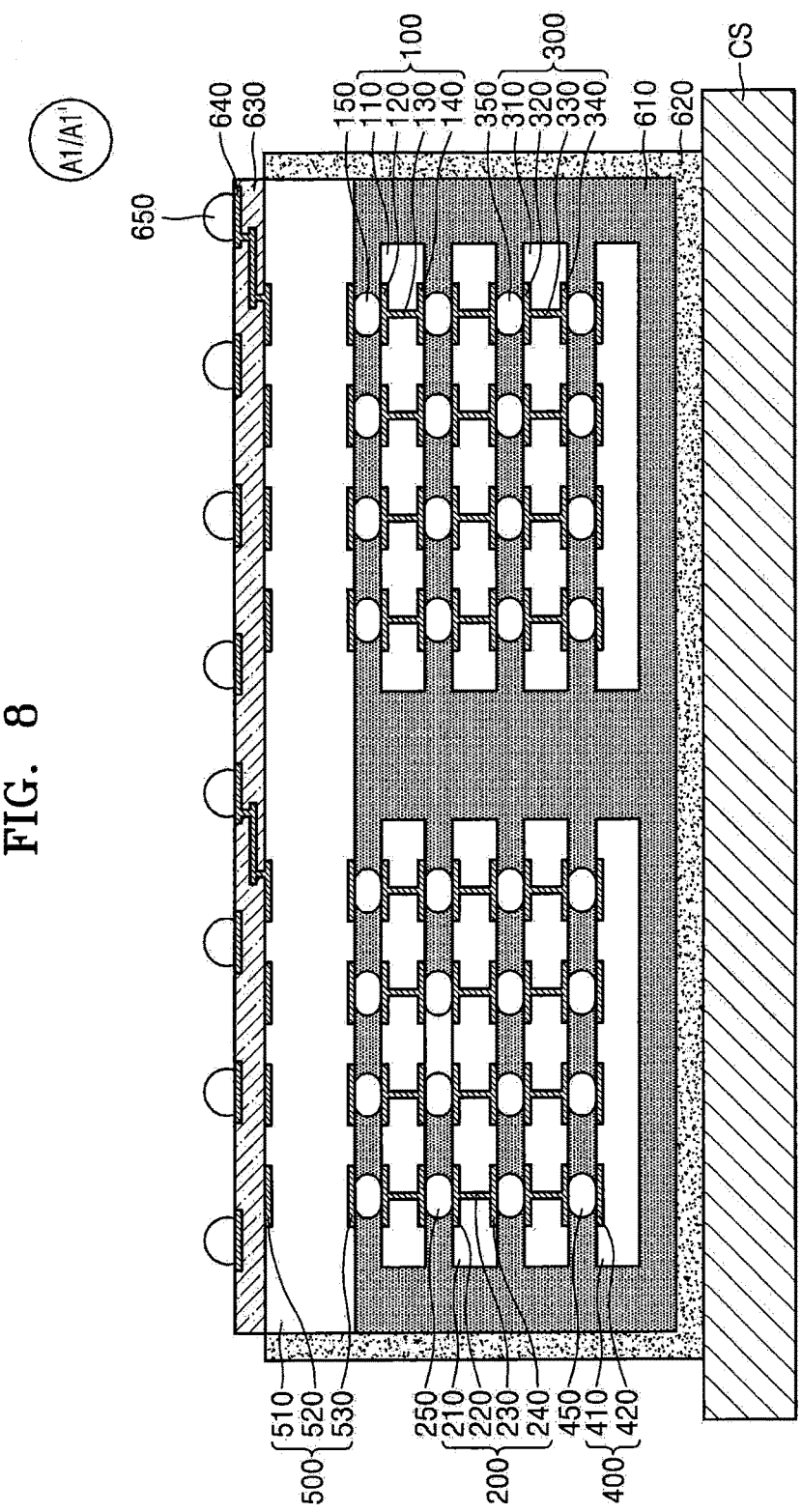

Referring to FIG. 8, an external connection member 650 may be formed on the redistribution line layer 640.

The external connection member 650 may transmit electric signals of an external device, such as a mainboard, and the first to fourth semiconductor chips 100 to 400 to each other. A plurality of external connection members 650 may be formed on the redistribution line layer 640. The external connection member 650 may include, for example, a solder ball and/or a solder bump. The external connection member 650 may include the same material and the same form as the first to fourth connection members 150 to 450.

The process of forming the external connection member 650 on the redistribution line layer 640 may be performed in the first semiconductor manufacturing environment A1 or the semiconductor manufacturing environment A1' that is similar to the first semiconductor manufacturing environment A1.

Figure 9:
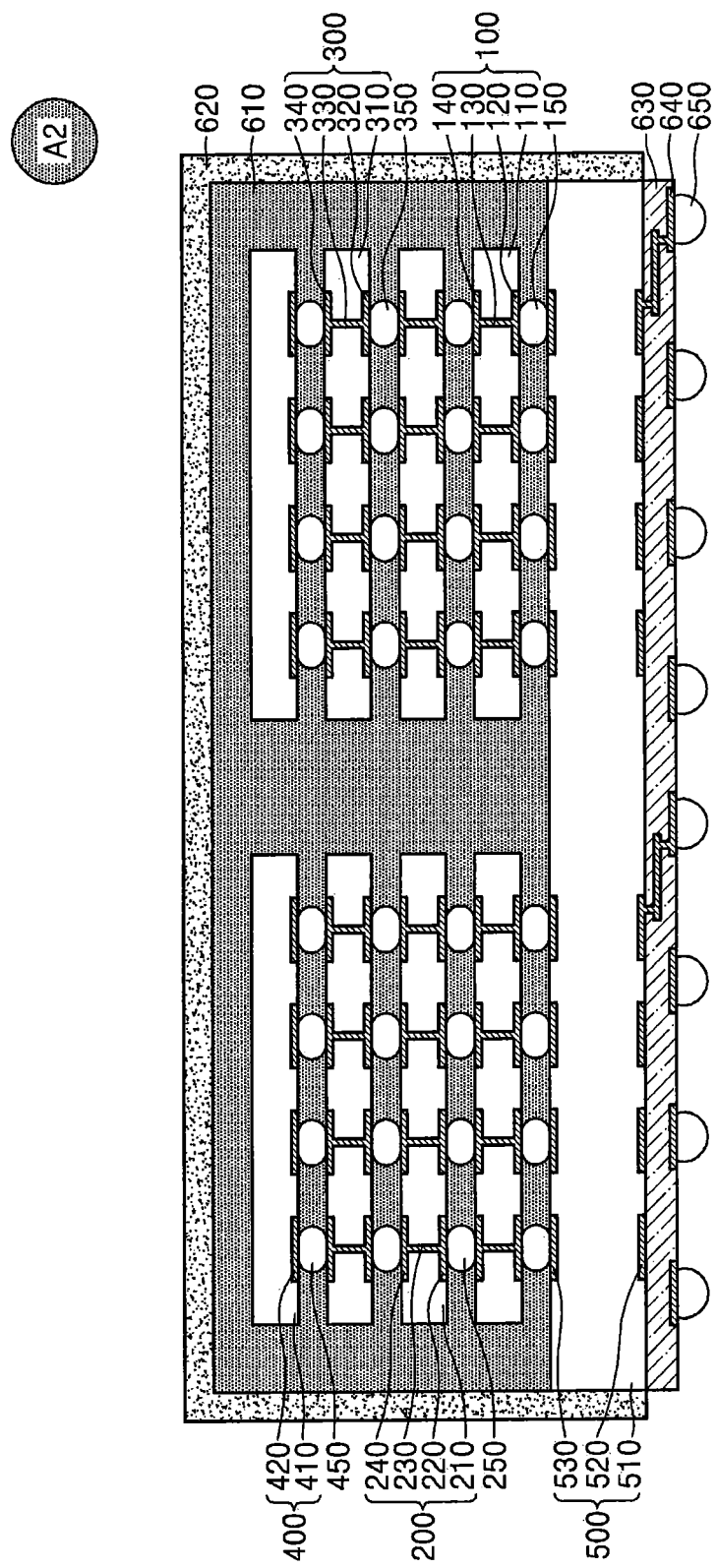

Referring to FIG. 9, the carrier substrate CS (refer to FIG. 8) may be removed.

After forming the redistribution line layer 640 and the external connection member 650 on the lower surface of the substrate 500, the carrier substrate CS may be removed in the second semiconductor manufacturing environment A2.

The process of removing the carrier substrate CS may be performed by a physical method using a blade, a chemical method using an isolating solvent, laser abrasion using laser, or the like.

Figure 10:
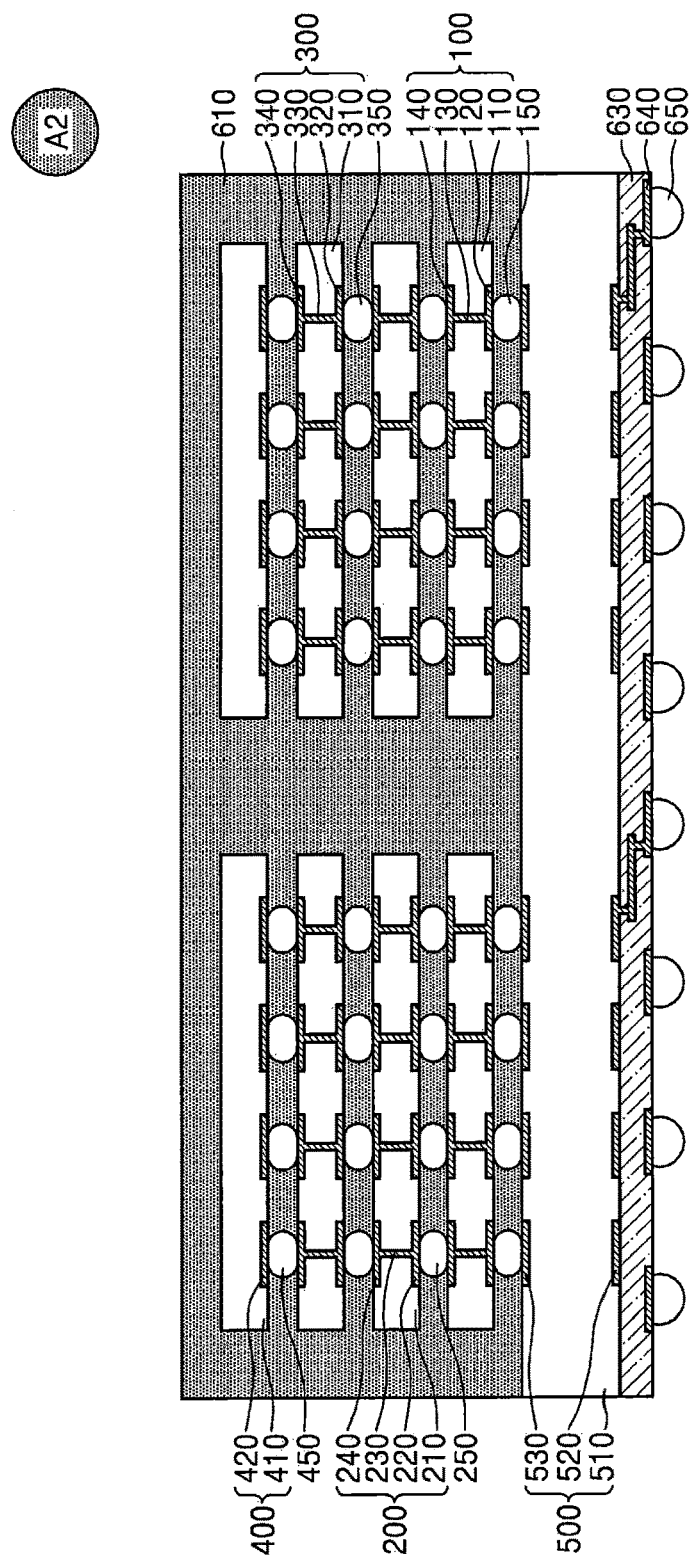

Referring to FIG. 10, the capping member 620 (refer to FIG. 9) may be removed.

The capping member 620 may be removed or be maintained as is by taking into account efficiency of a succeeding semiconductor package manufacturing process and other various matters. For example, when a marking pattern including information regarding the semiconductor package 10 (refer to FIG. 11) is generally formed on a surface of the molding member 610 by a laser irradiation method, a process condition different from existing one may be required due to the existence of the capping member 620, and thus, in this case, the capping member 620 may be removed.

Accordingly, the capping member 620 may be removed or be maintained as is in the second semiconductor manufacturing environment A2 by taking such a succeeding semiconductor package manufacturing process into account.

Figure 11:
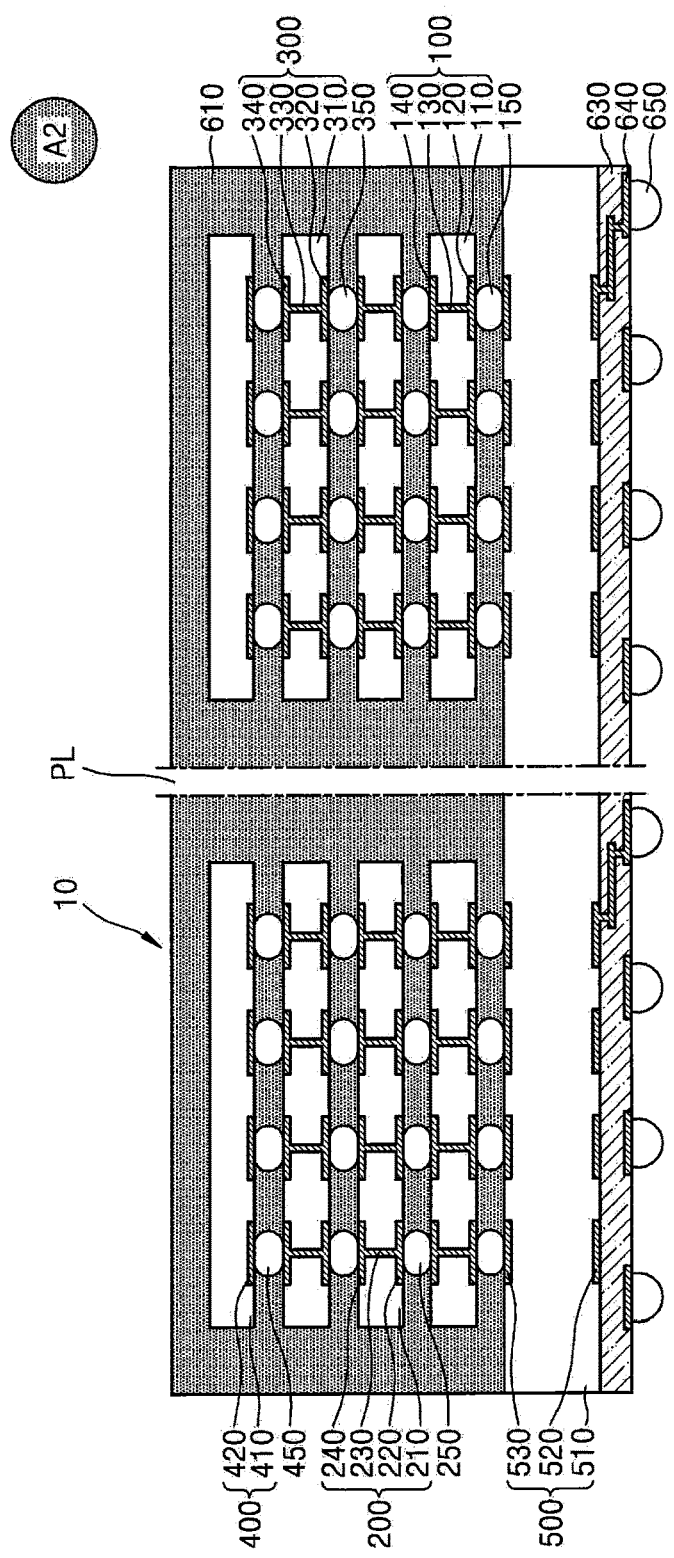
Figure 12:
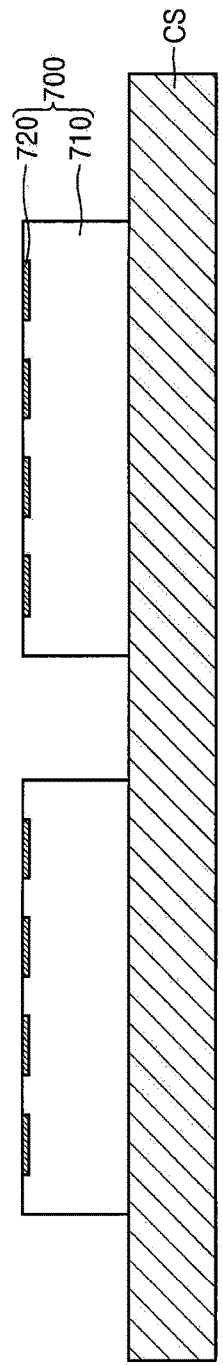

Referring to FIG. 11, the substrate 500 and other elements may be cut through a package separation lane PL and be separated into individual semiconductor packages 10.

The first to fourth semiconductor chips 100 to 400 may be configured as at least one set on the substrate 500, and the package separation lane PL may be present between each set. The substrate 500 and various types of material films may be cut along the package separation lane PL in the second semiconductor manufacturing environment A2 and be physically separated into individual semiconductor packages 10.

As described above, according to some embodiments of the present inventive concepts, a contamination source generated from a material included in the molding member 610 may be possibly prevented from being exposed to an external environment, such as a clean room, by forming the capping member 620, and thus, a process of forming the redistribution line layer 640 may be performed in the first semiconductor manufacturing environment A1, thereby increasing manufacturing efficiency and manufacturing yield of the semiconductor package 10.

FIGS. 12 to 18 are cross-sectional views illustrating a method of manufacturing a semiconductor package according to some embodiments of the present inventive concepts. In some embodiments, process steps illustrated in FIGS. 12 to 18 may be performed sequentially in order.

Referring to FIGS. 12 through 18, a fifth semiconductor chip 700 may be mounted on the carrier substrate CS in the second semiconductor manufacturing environment A2. For convenience of description, two fifth semiconductor chips 700 are shown in the drawings as being separately mounted on the carrier substrate CS. However, the present disclosure is not limited thereto.

The fifth semiconductor chip 700 may be manufactured in the first semiconductor manufacturing environment A1 in substantially the same manner as that described with reference to FIG. 1.

A semiconductor package 20 according to one or more embodiments is generally called a fan out-wafer level package (FO-WLP). The FO-WLP may be manufactured by covering the fifth semiconductor chip 700 with a first molding member 810, forming a redistribution line layer 840 on an upper surface of the fifth semiconductor chip 700 and the first molding member 810, and forming an external connection member 850 on the redistribution line layer 840.

A semiconductor package that includes both an external connection member 850 overlapping the fifth semiconductor chip 700 and an external connection member 850 not overlapping the fifth semiconductor chip 700 is referred to as an FO-WLP.

An FO-WLP manufacturing process, which is a type of a semiconductor package manufacturing process, is technology that allows a semiconductor chip to be directly mounted not on a printed circuit board but on a silicon wafer. Because the printed circuit board is not used, manufacturing cost may decrease, and small thickness and excellent heat dissipation characteristics may be obtained.

Not the printed circuit board but the silicon wafer directly serves as a substrate, and accordingly, unlike a sixth semiconductor chip 900 (See e.g., FIG. 19), a backgrinding process may not be performed on the fifth semiconductor chip 700. Thus, the fifth semiconductor chip 700 may be relatively thicker than the sixth semiconductor chip 900.

Figure 13:
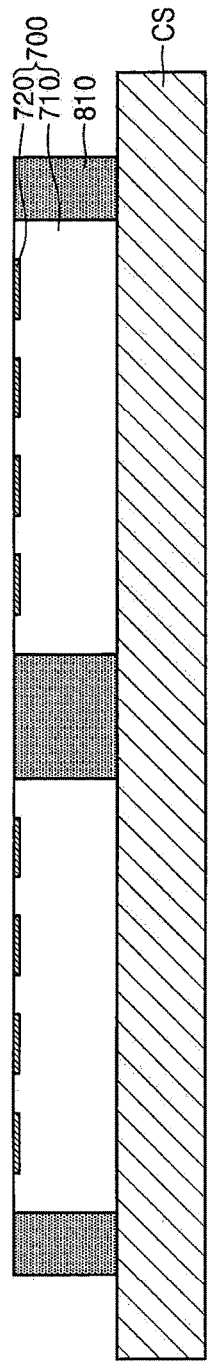

Referring to FIG. 13, the first molding member 810 covering the fifth semiconductor chip 700 may be formed in the second semiconductor manufacturing environment A2.

The first molding member 810 may protect the fifth semiconductor chip 700 from external influence such as shock. Also, in the FO-WLP, the first molding member 810 not only may protect the fifth semiconductor chip 700 but also may form an extended region where the external connection member 850 (refer to FIG. 18) may be located.

In order to play such a role, the first molding member 810 may include an EMC, resin, or the like. As described above, the EMC and resin, which are materials used to form the first molding member 810, may generally cause a contamination source such as fine dust. The contamination source may degrade cleanliness of a clean room, and thus, a process of forming the first molding member 810 may be performed in an environment different from that for a process of manufacturing a semiconductor device. That is, the process of forming the first molding member 810 may be performed in the second semiconductor manufacturing environment A2 having cleanliness that is less than that of the first semiconductor manufacturing environment A1.

Figure 14:
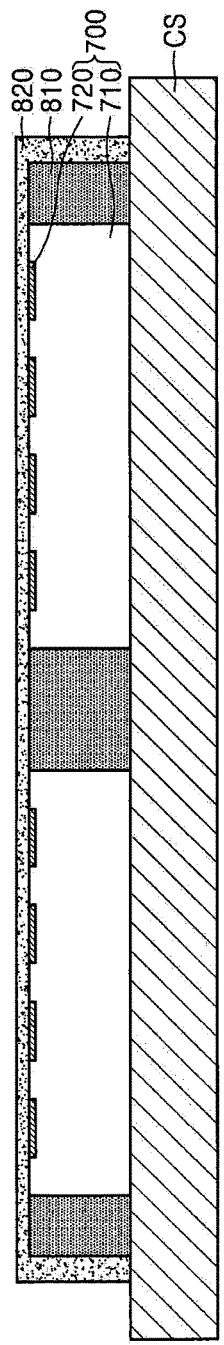

Referring to FIG. 14, a capping member 820 including a material different from that of the first molding member 810 and covering the first molding member 810 and the upper surface of the fifth semiconductor chip 700 not to expose the first molding member 810 may be formed.

The capping member 820 may entirely cover side surfaces and an upper surface of the first molding member 810 not to expose any portion of the first molding member 810 to the outside. Also, the capping member 820 may cover the upper surface of the fifth semiconductor chip 700. The process of forming the capping member 820 may be performed in the second semiconductor manufacturing environment A2. In some embodiments, the capping member 820 may cover an entirety of an exposed outer surface of the first molding member 810 that is exposed by the fifth semiconductor chip 700 and the carrier substrate CS as illustrated in FIG. 14. Accordingly, the first molding member 810 is surrounded by the capping member 820, the fifth semiconductor chip 700 and the carrier substrate CS when viewed in cross section.

The capping member 820 may include, for example, an insulating material such as a silicon oxide film, a silicon nitride film, or a silicon oxynitride film, which is a material proved to be usable in the first semiconductor manufacturing environment A1. The capping member 820 is substantially the same as the capping member 620 described with reference to FIG. 5, and thus, detailed descriptions thereof will be omitted.

Figure 15:
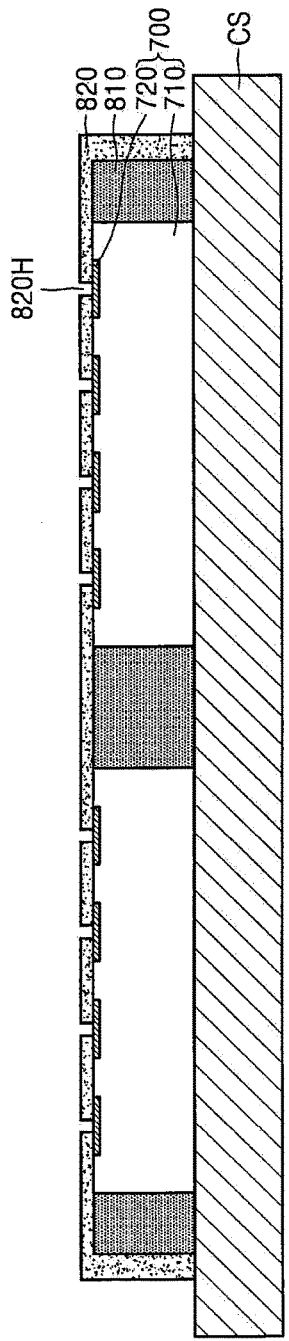

Referring to FIG. 15, in the first semiconductor manufacturing environment A1 or the semiconductor manufacturing environment A1' that is similar to the first semiconductor manufacturing environment A1, a contact hole 820H may be formed in a portion of the capping member 820 not to expose the first molding member 810.

The contact hole 820H may be formed in the capping member 820 to expose a portion of a connection pad 720 formed on the upper surface of the fifth semiconductor chip 700. The redistribution line layer 840 (refer to FIG. 16) and the fifth semiconductor chip 700 may be electrically connected to each other through a conductive material filling the contact hole 820H.

The contact hole 820H may be formed by semiconductor device manufacturing equipment in the first semiconductor manufacturing environment A1 or the semiconductor manufacturing environment A1' that is similar to the first semiconductor manufacturing environment A1. That is, the contact hole 820H may be formed by a general photo-process and etching process. That is, a problem of investing in equipment only for the semiconductor package manufacturing process after forming the first molding member 810 or having to change process design into a complex and difficult one may be lessened.

Referring to FIG. 16, the redistribution line layer 840 electrically connected to the fifth semiconductor chip 700 may be formed on the capping member 820 in the first semiconductor manufacturing environment A1 or the semiconductor manufacturing environment A1' that is similar to the first semiconductor manufacturing environment A1.

The redistribution line layer 840 may electrically connect the fifth semiconductor chip 700 to the outside. Also, an insulation layer 830 surrounding the redistribution line layer 840 may be formed. The redistribution line layer 840 may fill the contact hole 820H (refer to FIG. 15) formed in the capping member 820.

Materials included in the redistribution line layer 840 and the insulation layer 830 may be the same as or similar to the redistribution line layer 640 described with reference to FIG. 7, and thus, detailed descriptions thereof will be omitted.

The contamination source may not be discharged from the first molding member 810 because the capping member 820 may cover the first molding member 810, and thus, the redistribution line layer 840 and the insulation layer 830 may be formed on the upper surface of the fifth semiconductor chip 700 in the first semiconductor manufacturing environment A1 or the semiconductor manufacturing environment A1' that is similar to the first semiconductor manufacturing environment A1. Thus, the semiconductor package manufacturing process may be performed by using existing semiconductor device manufacturing equipment, and accordingly, manufacturing efficiency and manufacturing yield may increase, and manufacturing cost may decrease. For example, the redistribution line layer 840 and the insulation layer 830 may be formed by a general photo-process and etching process.

Referring to FIG. 17, the external connection member 850 may be formed on the redistribution line layer 840.

The external connection member 850 may transmit electric signals of an external device, such as a mainboard, and the fifth semiconductor chip 700 to each other. A plurality of external connection members 850 may be formed on the redistribution line layer 840 in the first semiconductor manufacturing environment A1 or the semiconductor manufacturing environment A1' that is similar to the first semiconductor manufacturing environment A1. The external connection member 850 may include, for example, a solder ball and/or a solder bump.

The external connection member 850 may be substantially the same as or similar to the external connection member 650 described with reference to FIG. 8, and thus, repeated descriptions thereof will be omitted.

Figure 18:
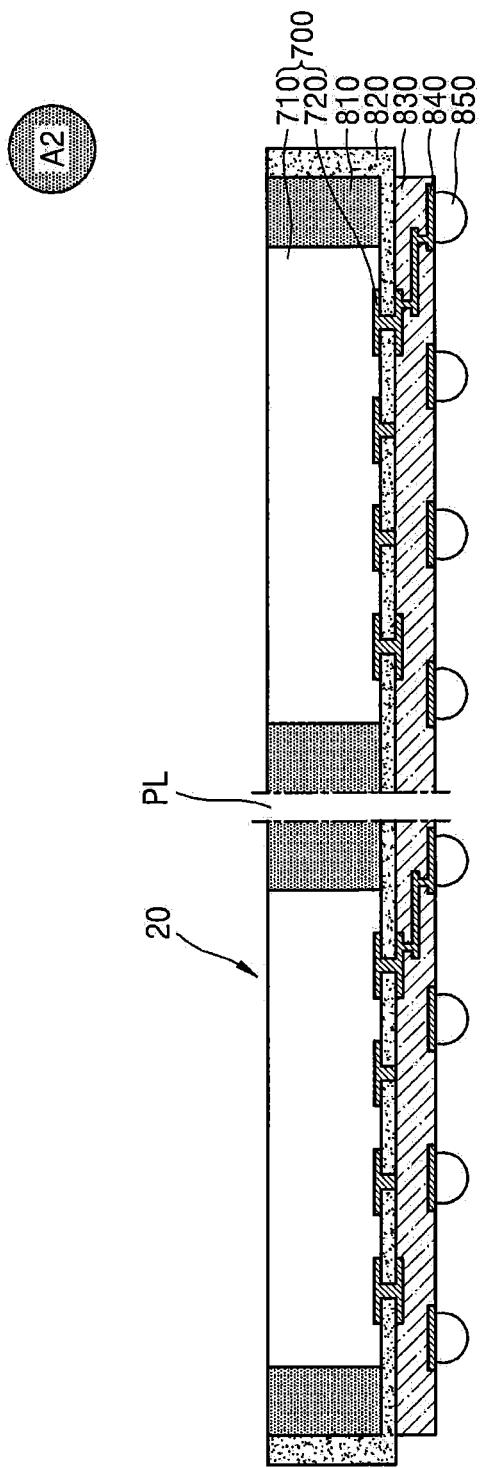

Referring to FIG. 18, the carrier substrate CS may be removed, and the first molding member 810 and other elements may be cut through the package separation lane PL and be separated into individual semiconductor packages 20.

In the second semiconductor manufacturing environment A2, the carrier substrate CS may be removed, and the first molding member 810 and various types of material films may be cut along the package separation lane PL and be physically separated into individual semiconductor packages 20.

The process of removing the carrier substrate CS is substantially the same as that described with reference to FIG. 9, and thus, repeated descriptions thereof will be omitted.

As described above, according to some embodiments of the present inventive concepts, a contamination source generated from a material constituting the first molding member 810 may be possibly prevented from being exposed to an external environment, such as a clean room, by forming the capping member 820, and thus, a process of forming the redistribution line layer 840 may be performed in the first semiconductor manufacturing environment A1, thereby increasing manufacturing efficiency and manufacturing yield of the semiconductor package 20.

Figure 19:
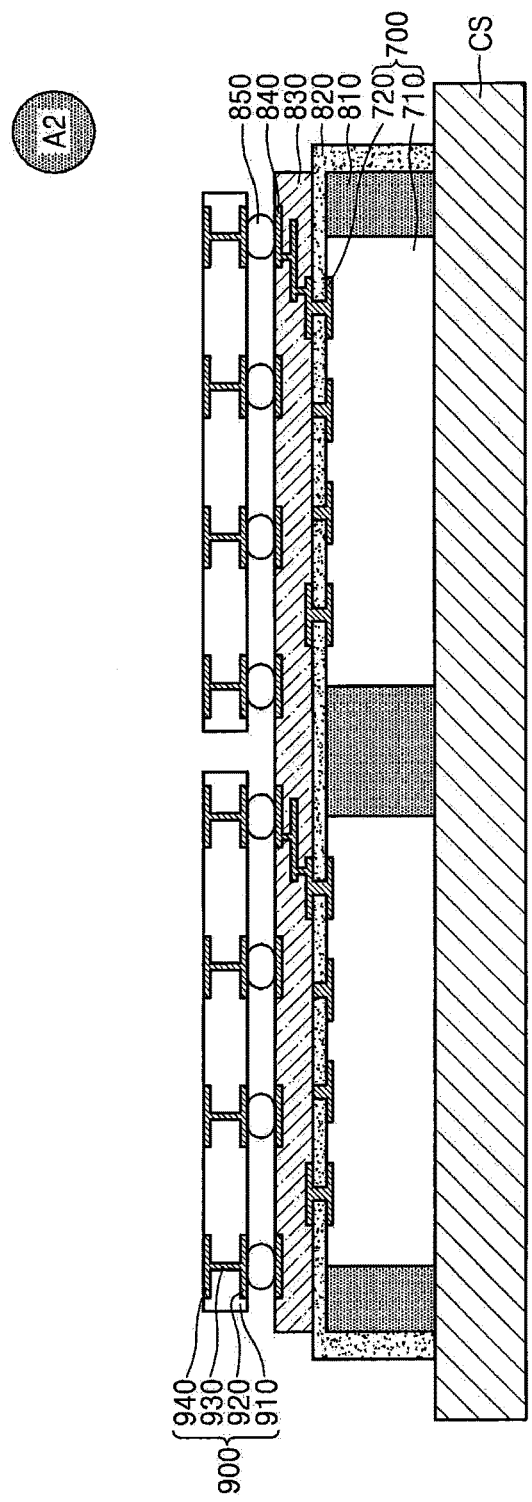
FIGS. 19 to 21 are cross-sectional views illustrating a method of manufacturing a semiconductor package according to some embodiments of the present inventive concepts.
Figure 20:
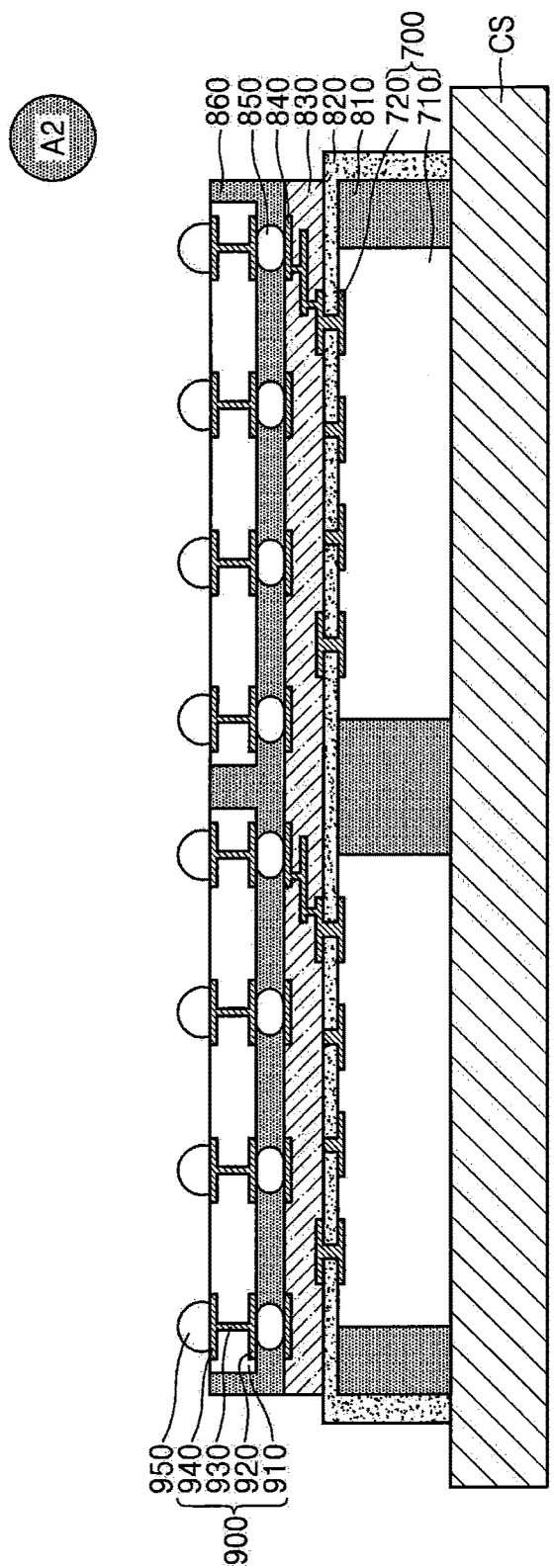
Figure 21:
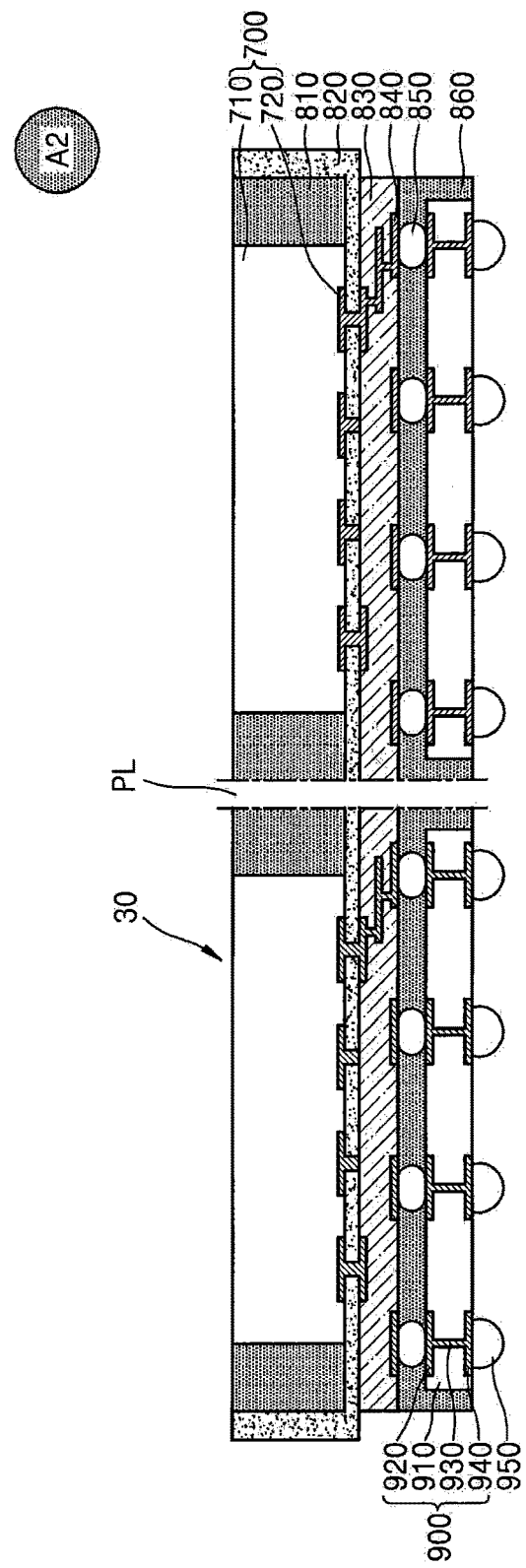

FIGS. 19 to 21 are cross-sectional views illustrating a method of manufacturing a semiconductor package according to some embodiments of the present inventive concepts. In some embodiments, process steps illustrated in FIGS. 19 to 21 may be performed sequentially in order.

Referring to FIG. 19, the sixth semiconductor chip 900 may be mounted on the redistribution line layer 840 via the external connection member 850.

The sixth semiconductor chip 900 may be formed in the second semiconductor manufacturing environment A2 to be electrically connected to the external connection member 850, and thus, a stack semiconductor package may be formed. The sixth semiconductor chip 900 may be manufactured in the same first semiconductor manufacturing environment A1 as the first semiconductor chip 100 of FIG. 1 and may have substantially the same uses, structures, forms, and technical features as the first semiconductor chip 100.

The sixth semiconductor chip 900 may include a sixth semiconductor substrate 910, a sixth lower connection pad 920, a sixth through silicon via 930, and a sixth upper connection pad 940.

The sixth semiconductor substrate 910 may include an upper surface and a lower surface opposite the upper surface thereof. The sixth through silicon via 930 may penetrate (i.e., may extend through) the sixth semiconductor substrate 910 and extend from the upper surface of the sixth semiconductor substrate 910 to the lower surface thereof, and may connect the sixth lower connection pad 920 and the sixth upper connection pad 940 to each other.

The fifth and sixth semiconductor chips 700 and 900 may be logic chips or memory chips. For example, both of the fifth and sixth semiconductor chips 700 and 900 may be memory chips of the same type. In some embodiments, one of the fifth and sixth semiconductor chips 700 and 900 may be a memory chip, and the other may be a logic chip.

Although the sixth semiconductor chip 900 stacked vertically is illustrated as an example, the number of semiconductor chips stacked in a semiconductor package 30 (refer to FIG. 21) is not limited thereto. For example, two, three, or four or more semiconductor chips may be stacked in the semiconductor package 30.

Referring to FIG. 20, a second molding member 860 covering side surfaces of the sixth semiconductor chip 900 may be formed, and a sixth connection member 950 may be formed on the lower connection pad 940 of the sixth semiconductor chip 900.

The second molding member 860 may include, for example, an EMC, resin, or the like. As described above, the EMC and resin, which are materials used to form the second molding member 860, may generally cause a contamination source. The contamination source may degrade cleanliness of a clean room, and thus, a process of forming the second molding member 860 may be performed in an environment different from that for a process of manufacturing a semiconductor device. That is, the process of forming the second molding member 860 may be performed in the second semiconductor manufacturing environment A2 having cleanliness that is less than that of the first semiconductor manufacturing environment A1.

Also, the second molding member 860 may include a material having a coefficient of thermal expansion (CTE) different from that of a material of the first molding member 810.

When a temperature change arises during a process of manufacturing the semiconductor package 30 (refer to FIG. 21), for example, in room temperature and high temperature environments, the first molding member 810 and the second molding member 860 may contract or expand in the same direction and cause transformation, such as bending, to a fifth semiconductor substrate 710 and the sixth semiconductor substrate 910. Such transformation of a semiconductor substrate is called warpage.

Due to a difference in CTEs of the fifth and sixth semiconductor substrates 710 and 910 and the first and second molding members 810 and 860 of the semiconductor package 30, tensile stress or compressive stress may be applied to the fifth and sixth semiconductor substrates 710 and 910, and thus, warpage may arise in the fifth and sixth semiconductor substrates 710 and 910.

The first molding member 810 and the second molding member 860 included in the semiconductor package 30 may have different CTEs from each other so that stress may be applied to the first molding member 810 and the second molding member 860 complementarily. In this case, warpage of a semiconductor substrate may be reduced. In some embodiments, the first molding member 810 and the second molding member 860 included in the semiconductor package 30 may have different CTEs from each other, and thus types of stress applied to the first molding member 810 and the second molding member 860 may be different. Accordingly, net stress may be reduced and warpage of a semiconductor substrate may be reduced.

It may be more efficient to reduce warpage by changing materials included in the first and second molding members 810 and 860 than to reduce warpage by replacing materials included in the fifth and sixth semiconductor substrates 710 and 910 with other materials.

Accordingly, the first molding member 810 and the second molding member 860 may have different CTEs from each other, thereby effectively controlling stress and reducing or possibly minimizing warpage. However, the present disclosure is not limited thereto. In some embodiments, depending on materials included in the fifth and sixth semiconductor substrates 710 and 910, the first molding member 810 and the second molding member 860 may have the same CTE.

Referring to FIG. 21, the carrier substrate CS may be removed, and the first molding member 810 and other elements may be cut through the package separation lane PL and be separated into individual semiconductor packages 30.

In the second semiconductor manufacturing environment A2, the carrier substrate CS may be removed, and the first molding member 810 and various types of material films may be cut along the package separation lane PL and be physically separated into individual semiconductor packages 30.

The process of removing the carrier substrate CS is substantially the same as that described with reference to FIG. 9, and thus, repeated descriptions thereof will be omitted.

As described above, according to some embodiments of the present inventive concepts, a contamination source generated from a material included in the first molding member 810 may be possibly prevented from being exposed to an external environment, such as a clean room, by forming the capping member 820, and thus, a process of forming the redistribution line layer 840 may be performed in the first semiconductor manufacturing environment A1, thereby increasing manufacturing efficiency and manufacturing yield of the semiconductor package 30.

Figure 22:
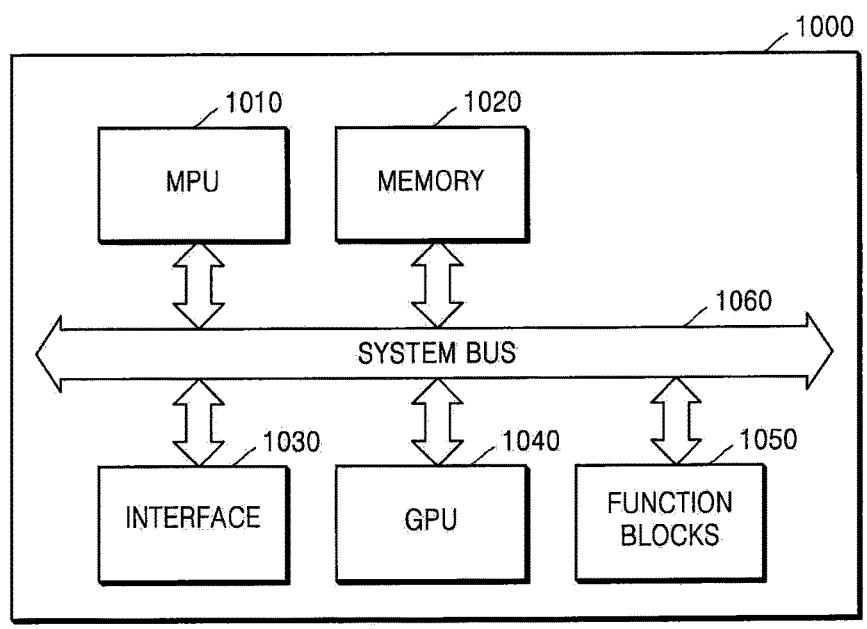
FIG. 22 schematically illustrates configurations of a semiconductor package manufactured by a method of manufacturing a semiconductor package according to some embodiments of the present inventive concepts.

FIG. 22 schematically illustrates configurations of a semiconductor package 1000 manufactured by a method of manufacturing a semiconductor package according to some embodiments of the present inventive concepts.

Referring to FIG. 22, the semiconductor package 1000 may include a micro processing unit (MPU) 1010, a memory 1020, an interface 1030, a graphic processing unit (GPU) 1040, functional blocks 1050, and a bus 1060 connecting these elements.

The semiconductor package 1000 may include both of the MPU 1010 and the GPU 1040 or may include only one of the MPU 1010 and the GPU 1040.

The MPU 1010 may include a core and an L2 cache. For example, the MPU 1010 may include multi-cores. The multi-cores may have the same performance as each other or different performances from each other. Also, the multi-cores may be simultaneously activated or may have activation time points differed from each other.

The memory 1020 may store a result processed in the functional blocks 1050 by control of the MPU 1010. The interface 1030 may exchange information or signals with external apparatuses. The GPU 1040 may perform graphic functions. For example, the GPU 1040 may perform video codec or may process three-dimensional (3D) graphics. The functional blocks 1050 may perform various functions. For example, when the semiconductor package 1000 is an application processor (AP) used in a mobile apparatus, some of the functional blocks 1050 may perform a communication function.

The semiconductor package 1000 may include the semiconductor package 10, 20, 30 described with reference to FIGS. 1 to 21.

While the present inventive concepts have been particularly shown and described with reference to embodiments thereof, it will be understood that various changes in form and details may be made therein without departing from the spirit and scope of the following claims. The above-dis-

What is claimed is:

1. A method of manufacturing a semiconductor package, the method comprising:
  manufacturing a semiconductor chip in a first semiconductor manufacturing environment;
  mounting the semiconductor chip on an upper surface of a printed circuit board, the printed circuit board comprising a lower surface opposite the upper surface;
  forming a molding member on the semiconductor chip in a second semiconductor manufacturing environment different from the first semiconductor manufacturing environment;
  forming a capping member comprising a material different from the molding member and covering an exposed outer surface of the molding member;
  attaching a carrier substrate onto the capping member, the semiconductor chip being between the printed circuit board and the carrier substrate;
  forming a redistribution line layer on the lower surface of the printed circuit board in a third semiconductor manufacturing environment different from the second semiconductor manufacturing environment, the redistribution line layer being electrically connected to the semiconductor chip;
  forming an external connection member on the redistribution line layer; and
  removing the carrier substrate.

2. The method of claim 1, wherein cleanliness of the first semiconductor manufacturing environment and the third semiconductor manufacturing environment is higher than that of the second semiconductor manufacturing environment.

3. The method of claim 1, wherein the capping member covers an entirety of the exposed outer surface of the molding member.

4. The method of claim 1, wherein the capping member comprises a silicon oxide film, a silicon nitride film and/or a silicon oxynitride film.

5. The method of claim 1, further comprising removing the capping member after removing the carrier substrate.

6. The method of claim 1, wherein the capping member covers side surfaces of the printed circuit board.

7. The method of claim 1, wherein the semiconductor chip comprises a plurality of semiconductor chips, and
  at least one of the plurality of semiconductor chips comprises a through silicon via.

8. The method of claim 1, wherein the external connection member comprises a solder ball and/or a solder bump.

9. A method of manufacturing a semiconductor package, the method comprising:
  manufacturing a first semiconductor chip;
  mounting the first semiconductor chip on a substrate;
  forming a first molding member covering side surfaces of the first semiconductor chip;
  forming a capping member comprising a material different from the first molding member and covering the first molding member and an upper surface of the first semiconductor chip; and
  forming a redistribution line layer on the capping member, the redistribution line layer being electrically connected to the first semiconductor chip,
  wherein the capping member covers an entirety of an exposed outer surface of the first molding member.

10. The method of claim 9, wherein forming the redistribution line layer comprises forming a contact hole in a portion of the capping member, and the contact hole does not expose the first molding member.

11. The method of claim 9, wherein the first semiconductor chip is a wafer level package.

12. The method of claim 9, further comprising mounting a second semiconductor chip on the redistribution line layer,
  wherein the second semiconductor chip is of a different type from the first semiconductor chip.

13. The method of claim 12, further comprising forming a second molding member covering side surfaces of the second semiconductor chip after mounting the second semiconductor chip.

14. The method of claim 13, wherein a coefficient of thermal expansion of the first molding member is different from that of the second molding member.

15. A method of manufacturing a semiconductor package, the method comprising:
  mounting a semiconductor chip on a first surface of a substrate, the substrate comprising a second surface opposite the first surface;
  forming a molding layer on the semiconductor chip;
  forming a capping layer entirely covering an exposed outer surface of the molding layer, the capping layer comprising a material different from the molding layer;
  attaching a carrier substrate to the capping layer, the semiconductor chip being between the substrate and the carrier substrate; and
  forming a redistribution line layer on the second surface of the substrate after forming the capping layer.

16. The method of claim 15, wherein the substrate comprises a printed circuit board, and
  wherein the redistribution line layer is electrically connected to the semiconductor chip.

17. The method of claim 15, wherein the capping layer comprises a silicon oxide film, a silicon nitride film and/or a silicon oxynitride film.

18. The method of claim 17, wherein the capping layer covers a side of the substrate.

19. The method of claim 17, wherein forming the molding layer and forming the capping layer are performed in a first environment having a first level of cleanliness, and
  wherein forming the redistribution line layer is performed in a second environment having a second level of cleanliness that is higher than the first level of cleanliness.

* * * * *